United States Patent [19]

Bacuvier

[11] 4,446,478

[45] May 1, 1984

[54] ASSEMBLY IN A SINGLE CASE OF A MAIN POWER-SWITCHING SEMICONDUCTOR COMPONENT AND A DESTORAGE DIODE

[75] Inventor: Pierre Bacuvier, Paris, France

[73] Assignee: Le Silicium Semiconducteur SSC, Paris, France

[21] Appl. No.: 211,945

[22] Filed: Dec. 1, 1980

[30] Foreign Application Priority Data

Dec. 7, 1979 [FR] France .................................. 79 30125

[51] Int. Cl.³ ........................................... H01L 23/16
[52] U.S. Cl. ........................................ 357/75; 357/13; 357/38; 357/46; 357/51; 357/55; 357/74; 357/76; 357/79
[58] Field of Search ....................... 357/13, 38, 46, 51, 357/55, 74, 75, 76, 79

[56] References Cited

U.S. PATENT DOCUMENTS 3,729,659 4/1973 Bennett et al. ......................... 357/76
3,975,758 8/1976 Schlegel ................................. 357/74
4,225,874 9/1980 Martinelli ............................... 357/13
4,231,054 10/1980 Ruetsch et al. ........................ 357/51

FOREIGN PATENT DOCUMENTS

2359787  6/1975  Fed. Rep. of Germany.
1452103  9/1966  France.
1567695  5/1969  France.
2009862  2/1970  France.
2024319  8/1970  France.
 510346  8/1971  Switzerland.

Primary Examiner—Edward J. Wojciechowicz
Attorney, Agent, or Firm—Cushman, Darby & Cushman

[57] ABSTRACT

In the pressure association of a main component such as a Darlington transistor or an amplifying gate thyristor and a storage diode, a specific destorage diode comprising an annular junction. Thus, transversally to the center of the diode a N+NN+ structure appears while, transversally to the periphery an N+NP structure exists.

11 Claims, 20 Drawing Figures

FIG_1 "PRIOR ART"   FIG_2

FIG_3 "PRIOR ART"   FIG_4

FIG_5 "PRIOR ART"   FIG_6

FIG_7

FIG_8

FIG_9

FIG_18

FIG_19

FIG_20

ASSEMBLY IN A SINGLE CASE OF A MAIN POWER-SWITCHING SEMICONDUCTOR COMPONENT AND A DESTORAGE DIODE

BACKGROUND OF THE INVENTION

The present invention relates to the assembly of a principal semiconductor component with an auxiliary circuit. It applies more particularly to power semiconductor components intended for switching.

The method of assembly in accordance with the present invention is more specifically relative to the association of a circuit of the destorage diode type with integrated amplification transistor circuits of the Darlington type or with thyristor circuits of the gate amplifying type. Thus, the nature and the structure of these special circuits will be recalled below with reference to FIGS. 1 to 6.

Figures 1, 2:
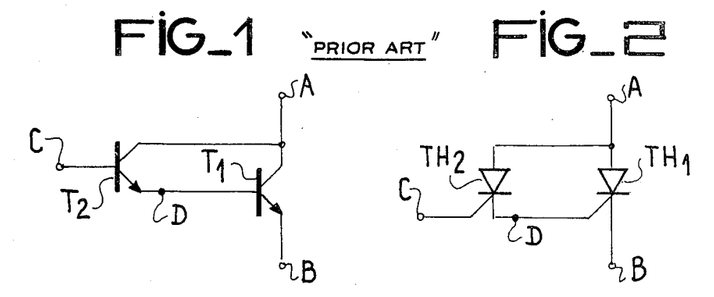

FIG. 1 shows a Darlington-type transistor circuit. This circuit comprises a first transistor or power transistor $T_1$ associated with a control transistor or pilot transistor $T_2$. The collectors of transistors $T_1$ and $T_2$ are interconnected and the emitter of transistor $T_2$ is connected to the base of transistor $T_1$. This circuit comprises three terminals: principal terminals A and B to which the signal to be switched is applied and a control terminal C. Terminal A corresponds to the collector of transistors $T_1$ and $T_2$, terminal B to the emitter of transistor $T_1$ and terminal C to the base of transistor $T_2$. For the user, this Darlington circuit appears as a particularly sensitive transistor.

FIG. 2 shows an amplifying gate thyristor circuit. This circuit comprises a main thyristor or power thyristor $Th_1$ and an auxiliary thyristor $Th_2$. The anodes of these thyristors are interconnected and the cathode of thyristor $Th_2$ is connected to the gate of thyristor $Th_1$. This circuit comprises three terminals: two principal terminals A and B to which the signal to be switched is applied and a control terminal C. Terminal A corresponds to the anodes of thyristors $Th_1$ and $Th_2$, terminal B corresponds to the cathode of thyristor $Th_1$ and terminal C corresponds to the gate of thyristor $Th_2$. This circuit behaves for a user like a single thyristor which is particularly sensitive and rugged on closing.

Thus a great similarity is seen between the Darlington type transistor circuits and the amplifying gate thyristor circuits. In both cases, the amplification stage formed by transistor $T_2$ or thyristor $Th_2$, respectively, could be a multiple stage comprising several transistors or several thyristors. In FIGS. 1 and 2, the control terminal of the main component is moreover shown by the same reference B. The similarity between the circuits of FIGS. 1 and 2 goes even further if we consider their construction in the conventional integrated form which is illustrated in FIGS. 3 and 4.

Figures 3, 4:
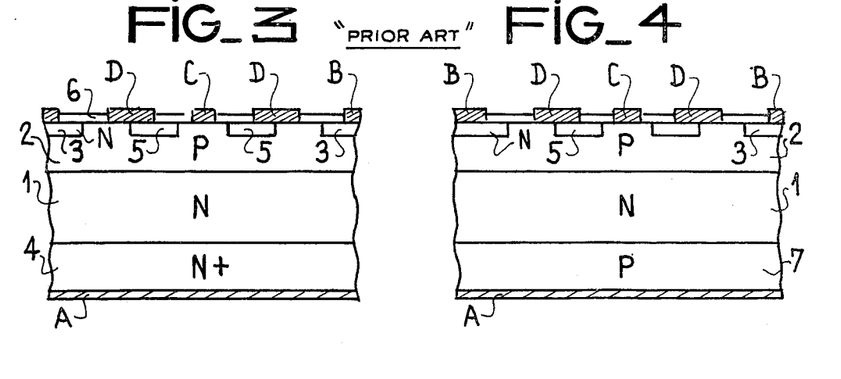

FIG. 3 shows a Darlington circuit transistor structure. The main transistor or power transistor $T_1$ is shown only partially and comprises an N collector layer 1, a P base layer 2 and an N emitter layer 3. The emitter is coated with an emitter metalization designated by the reference B and the collector layer is coated with a collector metalization designated by the reference A, with interpositioning of an overdoped N+ layer 4. The amplifying structure is formed by adding an N layer 5 (annular like layer 3 in the example shown) which corresponds to the emitter zone of the pilot transistor $T_2$. A central metalization C corresponds to the control terminal illustrated in FIG. 1 and a metalization D connecting the emitter layer of the pilot transistor to the base layer of the main transistor corresponds to terminal D of FIG. 1. Layer 6 which appears between the metalizations of the main face represents schematically a layer of a passivation material.

FIG. 4 shows very schematically an amplifying gate thyristor structure using the circuit of FIG. 2. This figure will not be described in detail. We will simply note its great similarity with FIG. 3. The essential difference resides in the fact that N+ layer 4 of FIG. 3 is replaced by a P layer 7. It will however be noted that the term thyristor should be understood as covering any four layer NPNP structure, i.e. not only conventional structures such as shown in FIG. 4 but also those inherent in amplifying gate thyristors. The thyristors may also have asymmetric NPNN+P type structures and structures using different forms of interdigitation not only for the power stage but also for the amplifier stages. Four-layer structures may also be bidirectional (Triac type).

The assembly of power structures such as those shown in FIGS. 3 and 4 often uses a technology of the pressed-contact type on the silicon disk, this latter being possibly previously alloyed or not on a counter-electrode made from molybdenum or tungsten for example. For putting the contacts under pressure, two approaches are currently used. One uses a so-called "screw" case integrating the pressurizing system by means of internal springs (so called conical washers). The other uses slightly deformable flat case technique, the pressure on the component then being applied directly by the user during insertion of the component into a convector (these cases are currently called double-face pressed cases). In each case, it is also possible to provide the electrical connection of the control by putting the control electrode contact (C) under pressure with a counter-electrode electrically accessible by the user. Whatever the type of case and component, the qualitative configuration of the contact tappings on the upper face is identical.

After these reminders about the nature and the structure of the particular power circuits formed by the Darlington assemblies of amplifying gate thyristors, an example will now be given of an auxiliary component which users often desire to use in relation with these particular power components. The structures, such as shown in FIGS. 1 and 2, do not lead to an optimum electrical configuration for the overall dynamic behavior of the integrated structure and more specifically during electrical opening. The origins of this limitation are, as is well known, essentially associated with the fact that it is difficult to assist electrically the opening of the component from the control electrode C accessible to the user of a conventional amplifying structure. In fact, in the case of the polarities of layers shown in FIGS. 3 and 4, it is desirable for facilitating the opening of the component to be able to apply a negative potential to the metalization D of the power stage so as to, for example, electrically extract by means of this electrode a part of the charges induced in the power stage during the preceding conduction. In fact, in the case of an integrated structure such as shown in FIGS. 3 and 4, the junction between layers 5 and 2 of the pilot amplifier stage is rapidly inhibited and opposes the extraction of a negative current on the control electrode of the power stage of the integrated structure, which considerably delays the dynamic opening possibilities of this latter.

Figures 5, 6:
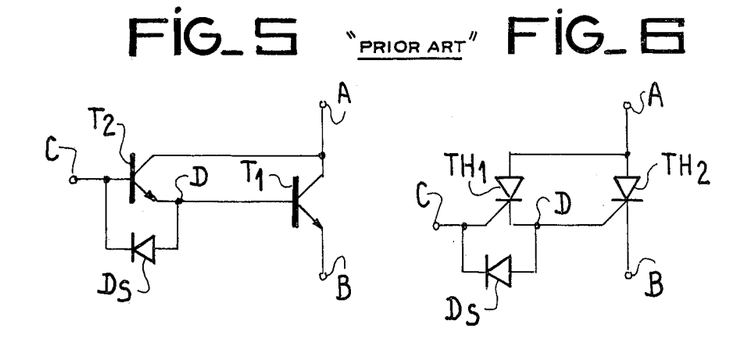

To resolve this difficulty, it is known, as schematically in FIGS. 5 and 6, that it is desirable to provide a shunt diode also called recovery diode or destorage diode between terminals D and C previously defined.

In the prior art, for assembling the auxiliary circuit formed by the destorage diode with the principal component, formed from a Darlington-type transistor or from an amplifying gate thyristor, three approaches have been used.

The first approach consists in integrating the destorage diode in the silicon disk of the principal component. This first approach seems the most attractive more particularly in the case of low-power devices for which the cost of construction constitutes one of the main industrial objectives. This approach presents nevertheless numerous electrical disadvantages because, on the one hand, of the presence of parasite coupling elements inherent in the integration and, on the other hand, of the absence of flexibility for adjusting the electrical characteristics of the destorage diode to the needs of the user. This limitation is particularly felt in the case of high-power devices.

The second approach consists in making terminals C and D accessible on the outside of the case of the power component and in wiring the destorage diode externally of the case. This second approach requires the provision of new specific cases, which constitutes a not inconsiderable industrial difficulty for the component manufacturer and imposes on the other hand on the user additional electric wiring operations.

The third approach consists in making terminal D accessible inside the case of the power component and in inserting the destorage diode in the case and in wiring it therein internally. This third approach leads to delicate technological wiring operations inside a case and requires, on the other hand, the use of overdimensioned cases for housing the destorage diode. There thus exists an insertion area lost for the power stage, i.e. for the performance of the component. In fact, the case forms one of the not inconsiderable cost elements for a power component.

SUMMARY OF THE INVENTION

Thus, one aim of the present invention is to provide a process and a structure for assembling a Darlington or amplifying gate thyristor type power component with a destorage diode, this process being simpler, more economical and more reliable than the processes of the prior art.

To achieve this aim, as well as others, the present invention provides assembly in a single case of a main power-switching semiconductor component of the Darlington or amplifying gate thyristor type and of an auxiliary component fulfilling particularly the function of destorage diode comprising pressure means for applying against each other facing metalizations of the front faces of the auxiliary and main components. The auxiliary component comprises in monolithic form: a substrate of a first type of conductivity; on the rear face of the substrate: a uniform layer of the same type of conductivity and with a high doping level, coated with a metalization; on the front face of the substrate: a first positioned layer of the second type of conductivity with a high doping level and a second positioned layer of the first type of conductivity with a high doping level, the surfaces occupied by each of these two layers being substantially complementary, first and second metalizations being respectively disposed on the first and second layers and coming electrically into contact with facing metalizations on the front face of the main component; which results in obtaining, between the rear face metalization and the front face metalization, a first resistance and, between the first and second front face metalizations, a second resistance in series with a diode.

The first positioned layer may be disposed at the periphery of the front face, the second positioned layer being disposed centrally. The rear face of the substrate may be hollowed out before formation of the highly doped layer on this face, substantially facing the second layer positioned on the front face, which results in a reduction of the first resistance, the depth of the hollowing-out being chosen depending on the desired value for this first resistance. The zone separating the first and second positioned layers may be grooved, which results in increasing the value of the second resistance, the dimensioning of the groove being selected to adjust the value of this second resistance. The first front face metalization may ensure short-circuits between the first positioned layer and a zone having the same type of conductivity as the substrate, which results in introducing a resistance in parallel across said diode.

Soft conducting elements such as balls or a large-grain powder may be integral with one at least of the facing faces of the two components for ensuring contact between the facing metalizations. Resilient conducting elements such as annular springs may be inserted between some at least of the facing metalizations. Inset conducting elements, such as metal grids, may be positioned on metalizations of the main component and come into contact with the metalizations of the auxiliary component, particularly when the metalizations in question are highly digited.

When the front face of the power-switching component comprises a principal metalization occupying the greatest part of its surface and on which a principal counter-electrode bears, the pressure means may bear on this principal counter-electrode or directly on the case of the main component. In this latter case, the pressure means may be formed by a metal, conducting and resilient finger fixed to an insulated part of the case and connected to a terminal external to the case, and pressing on the rear face of the auxiliary component, possibly through a conducting pin sliding freely in an insulating guide shell.

Among the advantages of the present invention will be noted the following points: the assembly is particularly simple and reliable. It is particularly economical because it allows the auxiliary circuit to be inserted into the case generally used for the main component with practically no modification of this case. It presents a versatile character since, depending on the needs of the user, separate auxiliary circuits may be associated with the same main component.

DESCRIPTION OF THE DRAWINGS

These aims, characteristics and advantages as well as others of the present invention will be discussed in detail in the following description of particular embodiments with reference to the accompanying figures in which:

FIGS. 1 to 6, serving to illustrate the state of the technique, have already been described;

DESCRIPTION OF THE PREFERRED EMBODIMENTS

In the different figures, it will be noted that the different layers, structures and components have not been drawn to scale, neither with respect to each other nor from one figure to the other, the dimensions having been selected solely, as is customary, to facilitate reading and understanding. Furthermore, in these figures, the same references designate identical or similar components, elements or layers.

Figure 7:
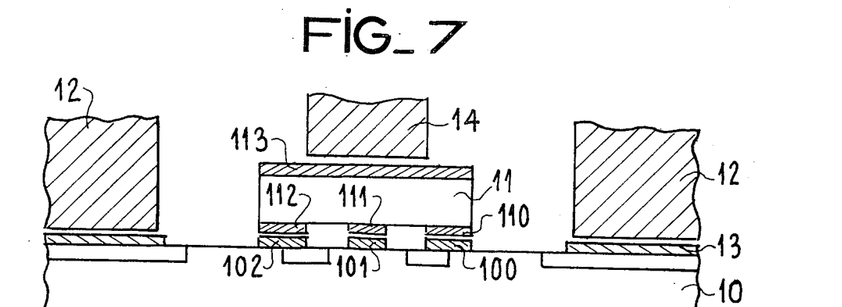
FIGS. 7 to 9 show schematically and by way of example, different methods of assembling auxiliary components with a main component.

FIG. 7 is intended to illustrate generally the process and the assembly method in accordance with the present invention. With a main semiconductor switching component 10 of the Darlington or amplifying gate thyristor type of which certain junctions have been shown solely by way of example but which may possibly comprise other junctions or junctions having other forms, one of the characteristics of the present invention resides in the fact of mounting, by application of a pressure to this main component 10, an auxiliary component 11 of the destorage diode type. This auxiliary component 11 comprises metalizations 110, 111 and 112 pressing directly or not against corresponding metalizations 100, 101 and 102 of the main component. Reference 12 designates a counter-electrode, in electrical contact with a main electrode 13 of the main component. Metalization 101 of the main component corresponds to terminal C, metalizations 100 and 102 are connected and form a ring corresponding to metalization D and metalization 13 corresponds to metalization B. A means 14 serves for transmitting the pressure force applying component 11 against component 10. This means 14 may be a counter-electrode coming into contact with an upper metalization 113 of the auxiliary component.

Figure 8:
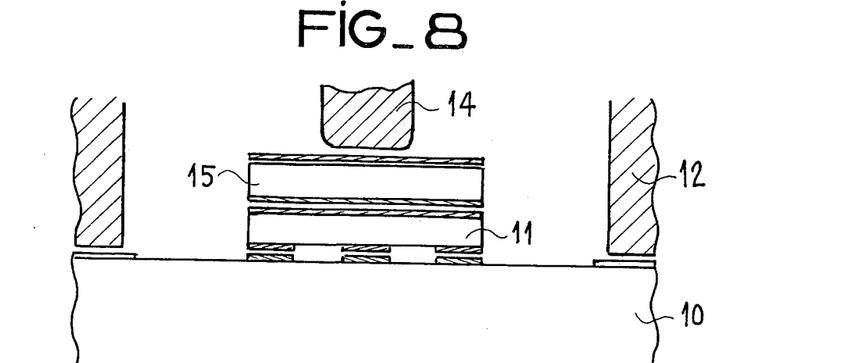
Figure 9:
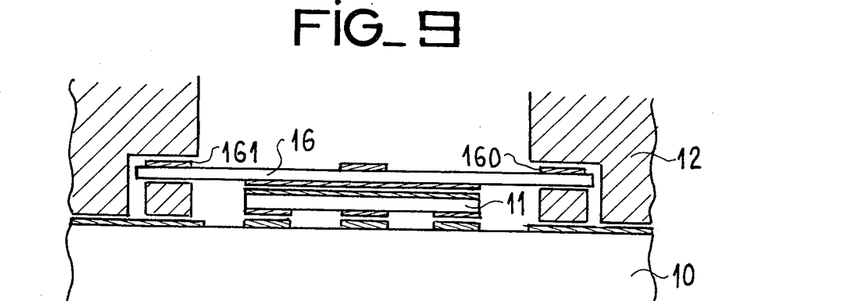

FIGS. 8 and 9 are intended for giving a better understanding of the general aspect of the present invention which is capable of numerous variations. For example, as shown in FIG. 8, a second auxiliary component 15 may be applied above component 11 by the same pressure means 14. As shown in FIG. 9, a second auxiliary component, designated in this figure by the reference 16, may have metalization 160 and 161 coming into contact with the principal counter-electrode 12. Similarly, the single component 11 could have come into partial electrical contact with this main terminal 12.

We can see brought out the principal advantages of the present invention, namely:

possible use of conventional pressed-assembly cases without any fundamental modification of these cases, no additional surface required for the insertion of auxiliary elements, possibility of modifying the auxiliary element so as to adapt it to a specific electric requirement without involving the design of the power component and its case, possibility of mounting the main component with or without an auxiliary component, possibility of great flexibility for defining precisely with the user the characteristics of the auxiliary element to be associated for a given electrical requirement, which promotes optimization of construction of this auxiliary component, no additional assembly cost, better electrical efficiency of the manufacture, absence of internal parasite effects due to the possible integration of the auxiliary circuit on the main component.

FIGS. 10A and 10B show schematically, respectively in section and in a top view, one embodiment of a destorage diode serving as an auxiliary component 11 in the case of FIG. 7. The destorage diode is in the form of a semiconductor substrate 20 of a first type of conductivity, for example of type N fairly heavily doped. On the rear face (face not intended to be applied against the main component) of the substrate there is formed a layer 21 of the same type of conductivity very heavily doped and a metalization 22. On the front face of the substrate (on the side intended to be applied on the front face of the main component) are formed a very heavily doped zone 23 of type P coated with a metalization 24 and, substantially in the zone not occupied by layer 23, a very heavily doped layer 25 of type N coated with a metalization 26. There is also shown in the figure a layer 27 of a passivation agent for passivating the junction outcrops. Passivation of the lateral junction outcrops of the diode may also possibly be provided. Thus there is obtained a tripole diode comprising a rear face metalization 22, and first and second front face metalizations 24 and 26. Layer 23 may have an annular form but this should not be considered as restrictive and the form of this layer and of metalization 24 will be adapted to match the surface metalization of the Darlington or gate amplification thyristor component such as shown in FIGS. 3 and 4, metalization 24 coming into electrical contact on metalization D, metalization 26 on metalization C.

Figure 10:
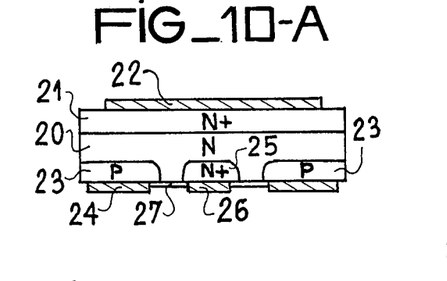
Figures 10A and 10B show in section and in a top view one embodiment of a tripole diode in accordance with the invention.
Figure 11:
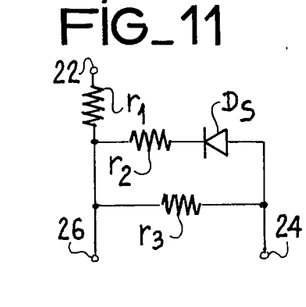
FIG. 11 shows a circuit equivalent to a tripole diode in accordance with the invention.

FIG. 11 shows an equivalent diagram of the tripole destorage diode of FIG. 10A. Between the front face metalizations 24 and 26, there is to be seen in series a destorage diode $D_S$ and a low-value resistance $r_2$. Between metalization 26 and the rear face metalization 22, we find a low-value resistance $r_1$. A resistance $r_3$ may be present or not between metalizations 24 and 26. It is so particularly in the case of a configuration such as that shown in FIG. 15.

Figure 12:
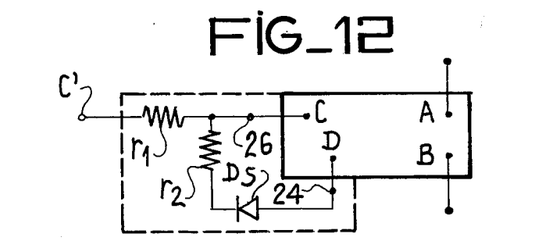
FIG. 12 shows the equivalent circuit of a tripole diode according to the invention and of a Darlington-type circuit.

FIG. 12 shows the diagram corresponding to the association of the destorage diode of FIG. 10 and a power component such as a Darlington or an amplifying gate thyristor shown in FIGS. 1 to 4. The same references designate the same elements.

Figure 13:
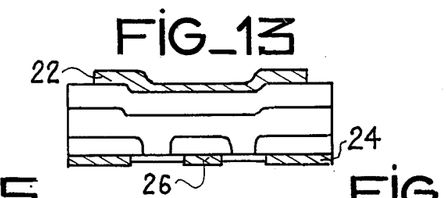
FIGS. 13 to 15 show variations of tripole diodes in accordance with the present invention.
Figure 14:
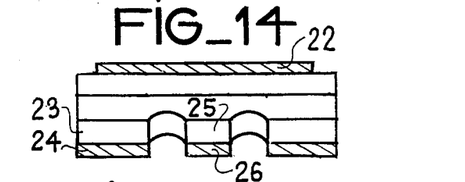

It may be desirable for particular applications to control accurately the values of resistances $r_1$, $r_2$ and $r_3$. Irrespective of the choice of dimensions of the component and of the choice of the doping levels of its different layers, techniques such as shown in FIGS. 13 and 14 may be used. In FIG. 13, the substrate has been locally hollowed out on its rear face, for example by chemical etching, before effecting the diffusion to form layer 21. There is thus obtained a reduction in the remaining thickness of the substrate between metalization 26 and metalization 22 and consequently a reduction of the value of resistance $r_1$. In FIG. 14, there is shown grooving at the boundary between opposite type layers 23 and 25. Thus the value of resistance $r_2$ can be increased. But of course, numerous other processes known in the technique may be used for adjusting the values of these resistances. It will more particularly be noted that resistance $r_1$ may be of a very low value because the destorage diode used in the application considered must never be subjected to high reverse voltages. The resistivity of its substrate 20 may then be very low, i.e. its doping level high.

Figure 15:
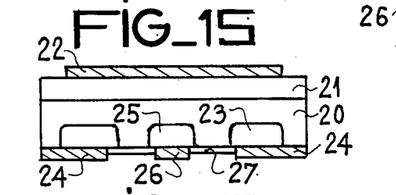

As another embodiment of the destorage diode, FIG. 15, in which the same references designate the same layers as in FIG. 10A, represents schematically the short-circuiting of layers 20 and 23 by metalization 24. This provides in the equivalent diagram of FIG. 11, a resistance $r_3$ in parallel across diode $D_3$. This short-circuiting may also be provided by short-circuit holes (nondiffused zones) passing through layer 23.

Figure 16:
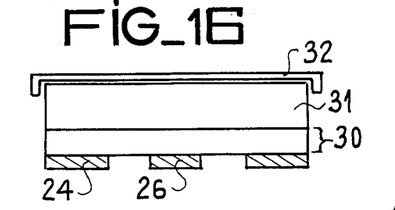
FIG. 16 illustrates a detail of the assembly structure of an auxiliary component in accordance with the present invention.
Figure 17:
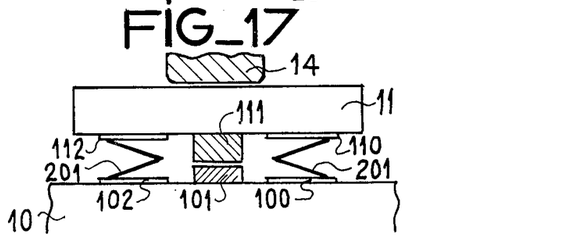
FIGS. 17 to 20 show in detail although schematically different embodiments of assemblies in accordance with the present invention.

As shown in FIG. 16, conventionally, the destorage diode 30 may be combined with or welded to a small metal counter-electrode 31, for example made from molybdenum or tungsten to reinforce the mechanical properties thereof. Similarly, electrical contacts 24 and 26 adjacent the power element may be adapted to facilitate the electrical and mechanical transmission, for example by means of relatively soft ductile materials such as silver. On the other hand, balls made from soft materials may be deposited on metalizations 24 and 26 to promote the mechanical contact connection with the main underlying element. Such balls or grains in relief could be deposited complementarily on the corresponding metalizations of the power component. There may also be disposed on the rear face of the auxiliary component an independent insert 32 made from a fairly soft ductile material for promoting contact with the pressing element. Similarly, the techniques used frequently for ramified contacts so as to facilitate placing them under pressure may be utilized within the scope of the present invention (two-level contact, insert grid . . .). Insert metal grids will advantageously be used when the metalizations on which the auxiliary component bears are heavily ramified or interdigited. To guarantee mechanical and electrical contact between contacts 24 or 26 and the power element, use may be had of an intermediate resilient connection instead of the soft contacts previously mentioned. For example, a flat annular spring 201 could be inserted between contact 24 and the associated contact of the power element (FIG. 17).

Different embodiments of means for pressurized mechanical assembly of an auxiliary component against a main component in accordance with the present invention will now be described.

Figure 18:
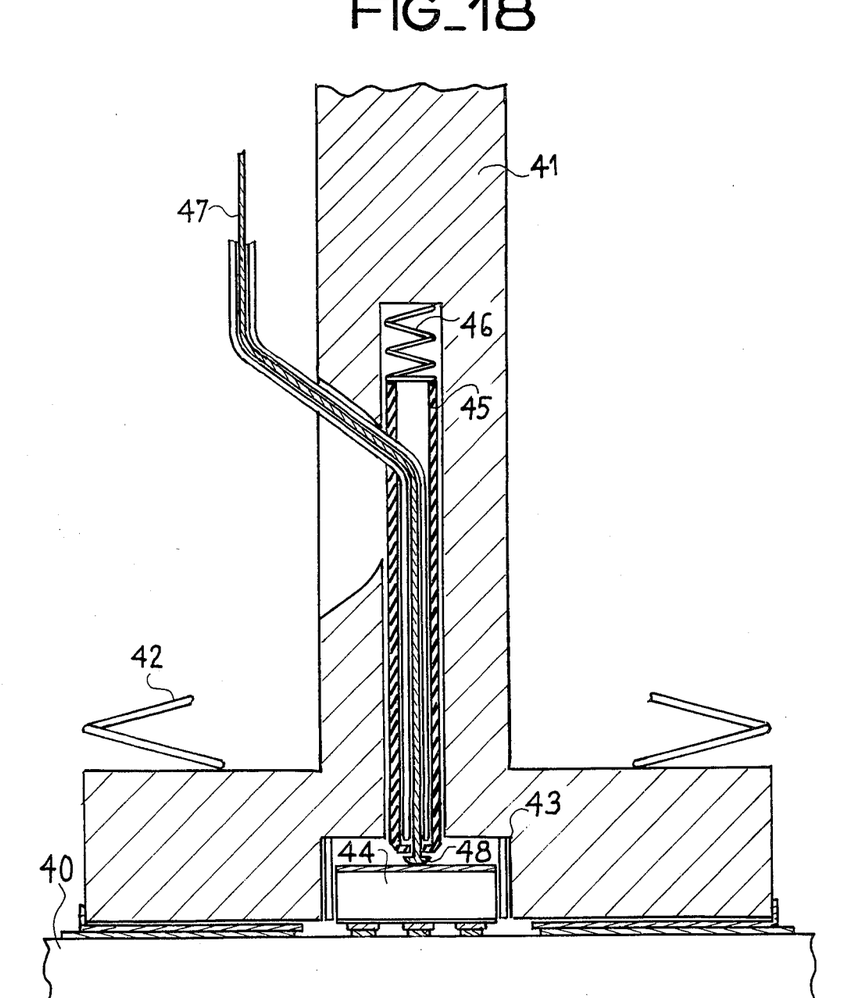

FIG. 18 illustrates the case where the main component 40 is mounted in a so-called screw case in which the pressure on a counter-electrode 41 is produced by springs internal to the case. These pressure means are shown schematically by conical washers 42. The auxiliary component 44 is then placed in a recess of the counter-electrode 41 from which it is insulated by means of a ring 43, for example made from ceramic. An elongated recess in counter-electrode 41 is occupied by a ring 45, made from ceramic or another rigid insulating material, pressed downwards by a spring 46. An insulated conducting wire 47 passes inside insulating cylinder 45 and comes to bear with its flared end 48 against the upper metalization of the auxiliary component. It will be noted that, in this embodiment, apart from the provision of the recess insulated by ring 44 at the base of the counter-electrode 41, in which the auxiliary component 43 is placed, the assembly is identical to the case where the auxiliary component is not provided.

Figure 19:
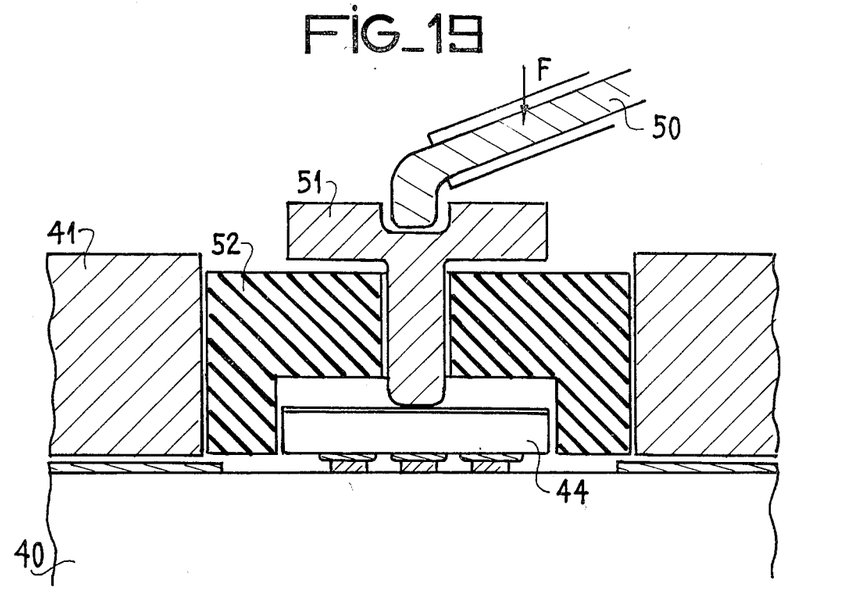
Figure 20:
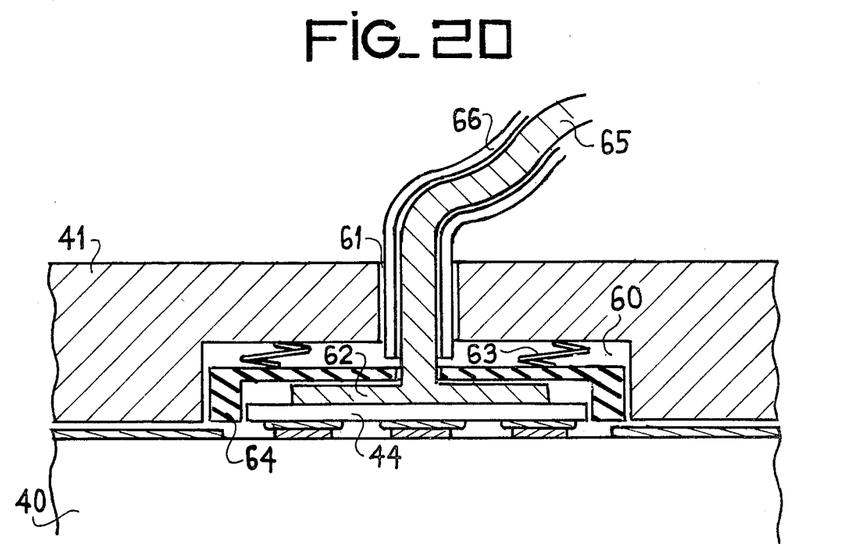

FIGS. 19 and 20 illustrate embodiments of the present invention in the case where the case for the main component is of the type with double-face pressure generated by the user during insertion in a convector. In the case of FIG. 19, the pressure on the auxiliary component is exerted by an electrode finger 50, integral with the insulating case of the main component. In the case of FIG. 20, the pressure on the auxiliary component is exerted by bearing on the principal counter-electrode 41.

In FIG. 19, we find again the main component 40, the counter-electrode 41, which is this time annular in shape and has a central recess, and the auxiliary component 44. A resilient and conducting finger 50, integral with the insulating part of the case and with an external terminal, causes a downward pressure force in the direction of arrow F. This pressing finger 50 bears on the auxiliary component 44 through a conducting pin 51. The conducting pin slides for example in an insulating shell 52.

In FIG. 20, we find again the main component 40, counter-electrode 41 and the auxiliary component 44. The counter-electrode 41 comprises a partial recess 60 and an axial hole 61 opening into this partial recess 60. A counter-electrode 62 bears against the rear face of the auxiliary component against which it is pressed by pressure means, such as springs 63 bearing against the internal face of the principal counter-electrode 41, insulating means such as a ceramic shell 64 being interposed so as to ensure insulation between the rear face of the auxiliary component and the principal counter-electrode. A wire or finger 65 is in contact or in direct connection with counter-electrode 62 and ensures a connection with an external terminal disposed in the case in an insulating zone thereof. The wire or finger 65 is provided preferably with insulation 66.

It should be noted that FIGS. 18 to 20 show solely particular assembly embodiments in accordance with the present invention. A man skilled in the art may for example simply combine FIGS. 18 to 20 to construct a unit in the case of a screw case in which spring 46 is replaced by means such as spring 63 and the insulating shell 64 of FIG. 20.

To give a better understanding of certain practical aspects of the present invention it should be noted that, in the case of a Darlington-type circuit, the main component may have a diameter of the order of 18 to 25 mm whereas the destorage diode has a diameter of the order of 5 to 10 mm. In the case of an amplifying gate thyristor type circuit, this component may have a diameter of 18 to 75 mm whereas the destorage diode has a diameter of the order of 2 to 5 mm.

The present invention is not limited to the embodiments which have been more explicitly described, it comprises on the contrary the different variations and generalizations thereof included within the scope of the following claims.

What is claimed is:

1. An assembly in a single case comprising:
    a main power-switching semiconductor component of the Darlington or amplifying gate thyristor type and having at least first and second metallizations on one face thereof with said first metallization being centrally located and said second metallization extending around said first metallization; and a three terminal auxiliary component defining at least a first resistance and a destorage diode in series with a second resistance and having in monolithic form a substrate of a first type of conductivity, a uniform layer of said first type of conductivity and with a heavy doping level on the rear face of said substrate, a metallization coating said uniform layer on said rear face, a first layer of the second type of conductivity with a high doping level on the front face of said substrate at the periphery thereof, a second layer of the first type of conductivity with a high doping level on the front face of said substrate centrally thereof, said first layer extending around said second layer, the surfaces occupied by said first and second layers being substantially complementary, first and second metallizations respectively disposed on said first and second layers so that said first resistance is formed between said rear face metallization and said second metallization and said diode in series with said first resistance is formed between said first and second metallizations;

said first and second metallizations of said main component being brought into electrical contact with said first and second metallization of said auxiliary component, respectively, by the application of pressure.

2. The assembly as claimed in claim 1, wherein, in the auxiliary component, the rear face of the substrate is hollowed out before formation of the heavily doped layer on the front face, which results in a reduction of the first resistance, the depth of the recess being chosen depending on the desired value for said first resistance.

3. The assembly as claimed in claim 1, wherein the zone separating the first and second layers is grooved so as to increase the value of said second resistance, the dimensioning of the groove being chosen so as to adjust the value of said second resistance.

4. The assembly as claimed in claim 1, wherein the first front face metalization short-circuits between the first positioned layer and a zone of the same type of conductivity as the substrate, which results in a resistance being introduced in parallel across said diode.

5. The assembly as claimed in claim 1, wherein soft conducting elements are integral with at least one of the opposing faces of the two components to ensure contact between the facing metalizations.

6. The assembly as claimed in claim 1, wherein conducting resilient elments comprising annular springs are inserted between at least some of the facing metalizations.

7. The assembly as claimed in claim 1, wherein insert conducting elements are positioned on the metalizations of the main component and come into contact with the metalizations of the auxiliary component.

8. The assembly as claimed in claim 1, in which the front face of the main component comprises a principal metalization occupying the largest part of its surface and on which bears a principal counter-electrode, wherein the pressure bears on said principal counter-electrode.

9. The assembly as claimed in claim 1, further including said case and wherein the pressure bears on the case.

10. The assembly as claimed in claim 9, wherein the pressure is produced from a resilient conducting metal finger fixed to an insulated part and connected to a terminal external to the case, and pressing on the rear face of the auxiliary component.

11. The assembly as claimed in claim 10, wherein the metal finger presses on the auxiliary component through a conducting pin sliding freely in an insulating guide shell.

* * * * *